United States Patent [19]

Christie et al.

[11] Patent Number: 5,049,836

[45] Date of Patent: Sep. 17, 1991

[54] HIGH VOLTAGE ELECTRICAL AMPLIFIER HAVING A SHORT RISE TIME

[75] Inventors: David J. Christie, Pleasanton; Gregory E. Dallum, Livermore, both of Calif.

[73] Assignee: The United States of America as represented by the United States Department of Energy, Washington, D.C.

[21] Appl. No.: 447,454

[22] Filed: Dec. 7, 1989

[51] Int. Cl.[5] ............................................. H03F 3/195
[52] U.S. Cl. .................................... 330/277; 330/286; 330/295; 330/300
[58] Field of Search ...................... 330/53, 56, 57, 277, 330/286, 295, 300; 372/10, 12, 13

[56] References Cited

U.S. PATENT DOCUMENTS

| | | | |
|---|---|---|---|
| 4,209,753 | 6/1980 | Riley | 330/51 |
| 4,221,472 | 9/1980 | Smith et al. | 372/21 X |
| 4,570,129 | 2/1986 | Milberger | 330/277 |
| 4,598,252 | 7/1986 | Andricos | 330/51 |
| 4,606,043 | 8/1986 | Aprille | 375/12 |
| 4,613,810 | 9/1986 | Jablonski | 323/271 |
| 4,631,491 | 12/1986 | Smithers | 330/149 |
| 4,647,868 | 3/1987 | Mueller | 330/286 |
| 4,733,194 | 3/1988 | Roehrs | 330/251 |

OTHER PUBLICATIONS

Matick, Richard E., *Transmission Line Pulse Transformers—Theory and Applications*, Proc. IEEE, vol. 56, No. 1, Jan. 1986, pp. 47-62.

*Primary Examiner*—James B. Mullins
*Attorney, Agent, or Firm*—J. D. McFarland; L. E. Carnahan; William R. Moser

[57] ABSTRACT

A circuit, comprising an amplifier and a transformer is disclosed that produces a high power pulse having a fast response time, and that responds to a digital control signal applied through a digital-to-analog converter. The present invention is suitable for driving a component such as an electro-optic modulator with a voltage in the kilovolt range. The circuit is stable at high frequencies and during pulse transients, and its impedance matching circuit matches the load impedance with the output impedance. The preferred embodiment comprises an input stage compatible with high-speed semiconductor components for amplifying the voltage of the input control signal, a buffer for isolating the input stage from the output stage; and a plurality of current amplifiers connected to the buffer. Each current amplifier is connected to a field effect transistor (FET), which switches a high voltage power supply to a transformer which then provides an output terminal for driving a load. The transformer comprises a plurality of transmission lines connected to the FETs and the load. The transformer changes the impedance and voltage of the output. The preferred embodiment also comprises a low voltage power supply for biasing the FETs at or near an operational voltage.

22 Claims, 6 Drawing Sheets

HIGH VOLTAGE ELECTRICAL AMPLIFIER HAVING A SHORT RISE TIME

The United States Government has rights in this invention pursuant to Contract No. W7405-ENG-48 between the U.S. Department of Energy and the University of California for the operation of Lawrence Livermore National Laboratory.

BACKGROUND OF THE INVENTION

1. Field of the Invention

The present invention relates to electrical amplifiers producing a high voltage output in a short rise time. More specifically, the present invention relates to high voltage electrical amplifiers that are computer controlled and have a short rise time.

2. Description of Related Art

As performance requirements of electrical and optical systems increase, the need has arisen for ever faster electronic control systems. The need for higher speeds of operation, and the type of equipment that can process electrical signals at that speed is typically related to the frequency of the signal that is to be processed; electrical equipment that amplifies audio signals (in the range of 20 Hz to 20 KHz) is far different from electrical equipment that processes microwave signals (1 GHz to 1000 GHz). For some applications, an electrical pulse is desirable. The sharpness of this pulse is determined in part by the frequency response of the electrical circuit that produces the pulse. A sharper pulse can be produced by a circuit that has a wider frequency response that includes higher frequencies; this circuit can also be characterized as having a faster rise time.

The need for electronic control of laser optical systems has created a great need for circuits having a fast rise time. The word "LASER" is actually an acronym for "Light Amplification by Stimulated Emission of Radiation". Laser light is electromagnetic radiation having a frequency much higher than microwave radiation, around $10^{15}$ Hz, equalling 1,000,000 GHz. Typically laser light is not defined in terms of frequency, but rather is described in terms of its wavelength in free space. For example, a standard HeNe laser has an output wavelength of 0.6328 $\mu$m in free space.

A common component in an optical system is an electro-optic modulator. This component is a crystal comprised of a material such as potassium dideuterium phosphate, known as KD*P. To modulate the laser light in the system, a large voltage is applied across the crystal. The applied voltage affects the indices of refraction along the axes of the electro-optic crystal. KD*P requires a voltage in the range of several kilovolts (KV) for effective modulation. It is often desirable to control the voltage as precisely and quickly as possible, in order to provide the necessary electro-optic response. A common application of electro-optic components is in Q-switching, where the electro-optic modulator is used to introduce cavity losses in an amount large enough to prevent laser oscillation and therefore a laser gain medium can be pumped to store a large amount of energy. Then, the Q-switch is actuated to allow laser oscillation in the laser cavity, and a high power pulse is suddenly released using the energy stored in the gain medium.

A typical electro-optic Q-switch is actuated by a voltage pulse of several KV that is applied as quickly as possible. Speed of operation is in part determined by how quickly the electronic circuit can apply the high voltage, which is determined by the rise time of the circuit, and affected by the capacitance of the system. Thus there is a need for an electronic circuit that has a fast rise time, while providing an output with a voltage in the KV range with a power necessary to overcome the capacitance of the load.

To obtain quick and precise control over the electro-optic modulator, it is desirable to connect it to a control system that can be programmed to provide any desired output waveform. For example, a pulse shaped in a particular manner may provide the optimum Q-switch in one laser application, and a pulse shaped in another way may provide the optimum Q-switch for another laser application. A computer, easily programmed, can provide a great deal of flexibility in determining the shape of the pulse. This shape can be determined in a program, and if a different pulse is desired, it is necessary only to change the program that determines the pulse.

Digital computers are available that have a response time as fast as several nanoseconds. These computers can function as a control circuit that determines the shape of a pulse. For example discrete digital integrated circuits based on the ECL (Emitter-Coupled Logic) technology have a response time of one or two nanoseconds. ECL components can be combined together by a digital designer to obtain a circuit having a response of several nanoseconds. This circuit can be connected to a standard high speed D/A (digital to analog) converter so that a digital number is converted to a discrete voltage level. However, integrated circuits (ICs) have an output that is limited in voltage and power. Typically the output of an IC will be no more that a few volts, far below the voltage necessary to operate an electro-optic modulator. For example, the digital designer may choose an output of 1.0 volt for ECL as the maximum voltage. Therefore, the output will vary between 0.0 volts and 1.0 volt. As a further limitation of IC components, the power that can be safely dissipated is typically in the tens of milliwatts (mW). This very low power dissipation makes it difficult for digital components to quickly overcome any significant capacitance.

An amplifier is needed to amplify the signal from the control circuit and provide a high voltage electrical output to the electro-optic modulator with as little delay as possible. It is desirable that the amplifier be stable at high frequencies, have a substantial gain in both current and voltage, have a fast rise time and a wide bandwidth (frequency response) including high frequencies. In some instances, feedback may be used to increase the bandwidth; however, feedback causes stability problems which affect the amplifier's ability to produce an accurate pulse. An amplifier with a fast rise time typically has stability problems that can cause an unpredictable amplifier response to high frequencies inherent in a quickly rising pulse.

A problem affecting the rise time of a circuit is its capacitance. The circuit capacitance affects the amount and time duration of current which must be applied to deposit a charge on the circuit components and thereby become operational. It is known that field effect transistors such as MOSFETs (Metal Oxide Semiconductor Field Effect Transistors) can provide a fast frequency response, once their capacitance is overcome. To account for the circuit's capacitance, the input to a MOSFET may be biased in an operating range wherein the relationship between input and output is approximately linear. The actual biasing circuitry embodied in any particular circuit is determined by a variety of design criteria, such as bandwidth, response time, and stability. For electro-optic applications, and for other pulsed power applications, there is a need for a circuit that can provide a very quick rise time and be stable at the high frequencies inherent in a quickly rising pulse.

Vacuum tubes are often used to amplify and switch high power pulses. However, they are bulky and expensive. It would be an advantage to provide a high power amplification and switching circuit comprising solid state components instead of vacuum tubes.

Another problem with pulsed power amplifiers is matching the output impedance of the amplifier to the impedance of the load. If impedance is not matched, the result may be an unwanted output waveform and a loss of output power. Typical transmission lines have an impedance of 50Ω, while other applications may have a different impedance.

SUMMARY OF THE INVENTION

The present invention provides a circuit for producing a pulse that has a very fast response time, that is responsive to digital control, and can produce a large voltage so that it can drive a component such as an electro-optic modulator with a voltage in the KV range. Furthermore, the present invention utilizes an impedance matching circuit that can be employed to provide virtually any output impedance.

The present invention comprises an electrical circuit for providing a pulse in response to an input control signal, said circuit comprising an amplifier and a transformer.

The preferred embodiment comprises an input stage for amplifying the voltage of the input control signal, a buffer for isolating the input stage from the output stage; and a plurality of current amplifiers connected to the buffer. The input stage to the amplifier accepts a signal with a voltage range of a few volts or less, so that it is compatible with the fastest digital components such as the ECL family. As an advantage, the pulse can be shaped digitally by programming a computer to form an accurate waveform on its rising edge.

Each current amplifier is connected to a field effect transistor (FET); an advantage is that the current amplifier helps to overcome the input capacitance of the FET. The FETs switch a high voltage power supply to an impedance transformer which then provides an output terminal for driving a load. The impedance transformer converts the impedance and voltage of the output to match the output load. The transformer comprises a plurality of transmission lines connected to the FETs and the load. The preferred embodiment comprises five 10Ω transmission lines, wound around ferrite cores, and connected so that the input impedance is 2Ω and the output impedance is 50Ω. The transformer also transforms the voltage; for example a 400 volt input is transformed to a 2000 volt output.

The preferred embodiment also comprises a low voltage power supply connected to the input stage, which biases the FETs. The constant voltage of this power supply passes through this circuit, with some amplification, thereby biasing the FETs at or near an operational voltage. The result is a circuit that is stable at high frequencies and during pulse transients. Furthermore, the output pulse is easily predicted from the input pulse provided by the computer program.

DETAILED DESCRIPTION OF THE INVENTION

The invention is best understood by reference to the figures wherein like parts are designated with like numerals throughout.

Figure 1:
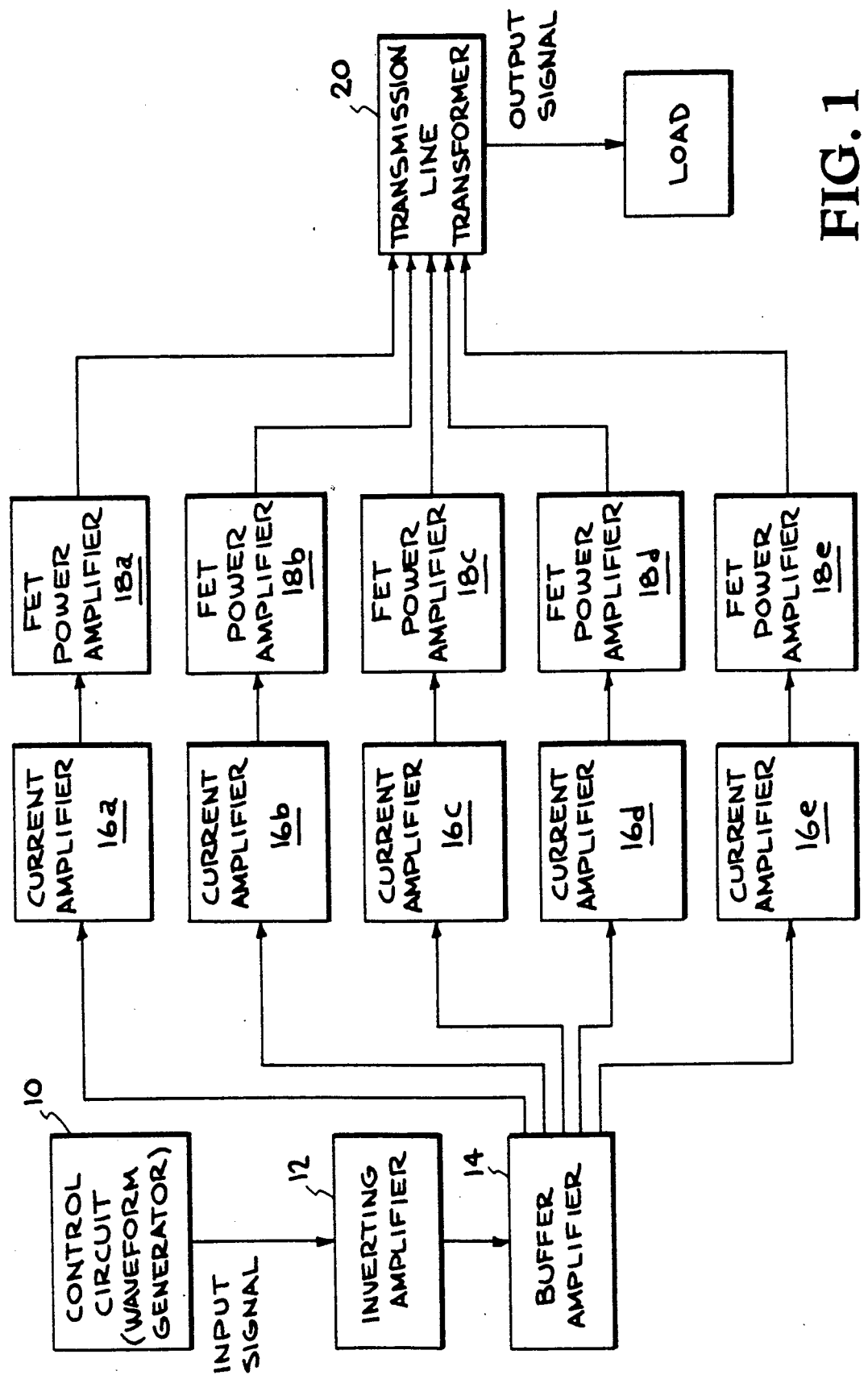
FIG. 1 is a block diagram of the preferred embodiment of the present invention.
Figure 2:
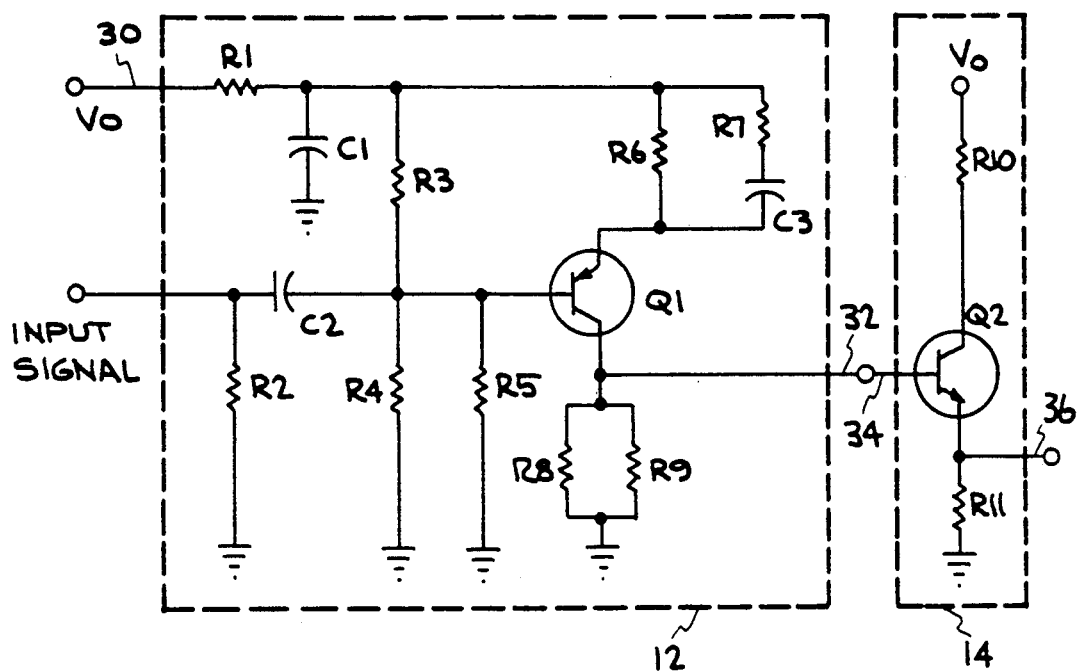
FIG. 2 is a circuit diagram of an input stage and buffer incorporated in the preferred embodiment of the present invention.
Figure 2:
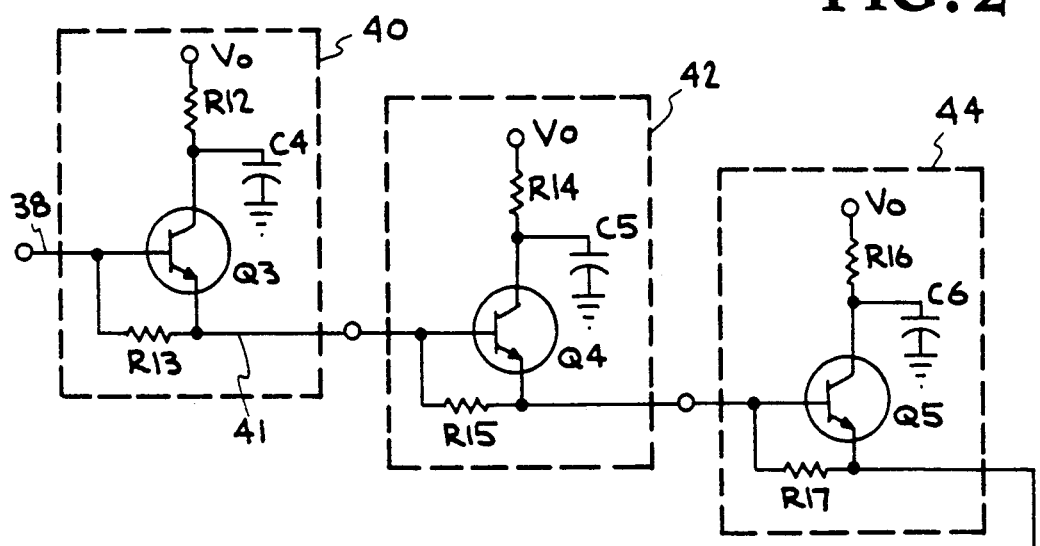
Figure 3:
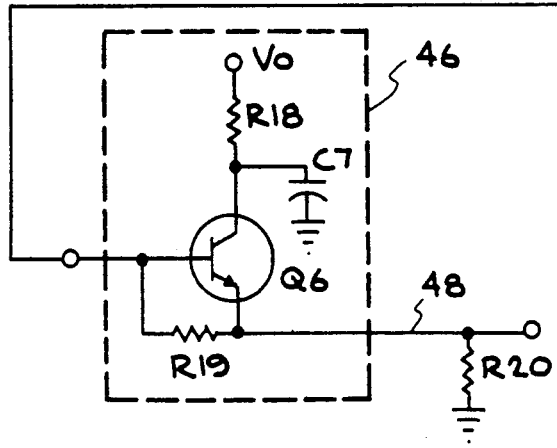
FIG. 3 is a circuit diagram of a current amplifier incorporated in the preferred embodiment of the present invention.
Figure 4:
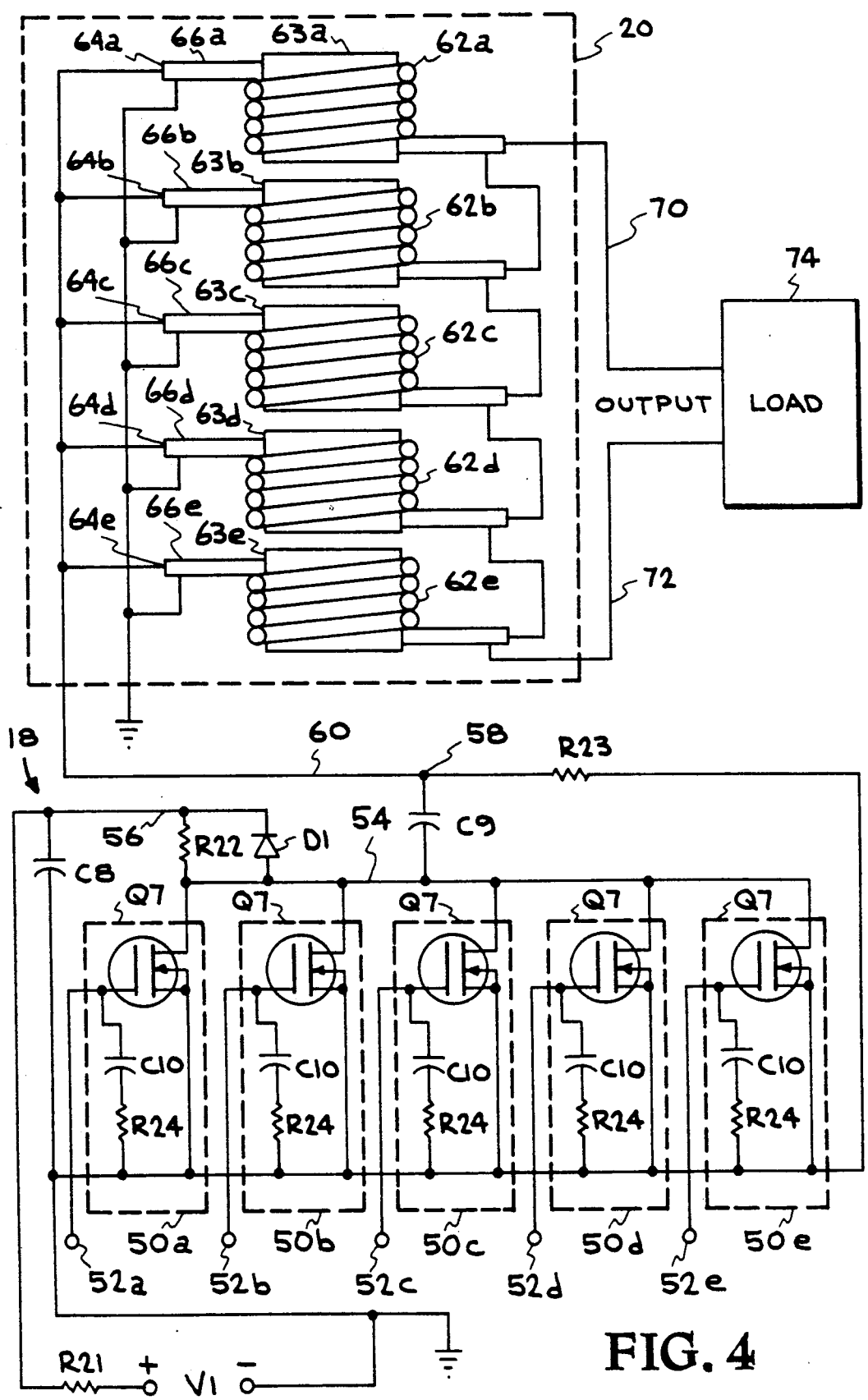
FIG. 4 is a circuit diagram of the FET power amplifiers and the impedance transformer of the preferred embodiment.

FIG. 1 illustrates the present invention from the perspective of a block diagram, while FIGS. 2, 3, and 4 illustrate specific circuit features of the preferred embodiment. The description begins with a discussion of FIG. 1.

An input signal to the electrical amplifier is generated in a control circuit 10. In the preferred embodiment, the control circuit 10 comprises a computer that is programmed to produce the desired input signal, and a D/A (digital to analog) converter that takes the digital output from the computer and translates it into an analog voltage. The computer, using for example ECL components, may produce an output wiht a voltage between 0.0 and −1.0 volts, and a clock period of a few nanoseconds. It will be apparent to one skilled in the art that circuits such as analog circuits, other digital circuits, or a combination of analog and digital circuits can produce an input signal that may be acceptable dependent upon the application.

The input signal is provided to an inverting amplifier 12, which functions as an input stage for the circuit of the present invention. The inverting amplifier 12 comprises a circuit to invert the input signal and amplify it with a voltage gain of 20, so that its voltage is between 0.0 and 20.0 volts. The output of the inverting amplifier 12 is provided to a buffer 14, which passes the voltage and amplifies the current. The output of the buffer 14 is provided to one or more current amplifiers 16. Preferably, each current amplifier 16 has an 80 dB current gain. The output of each of the current amplifiers 16 is connected to the input of a corresponding FET power amplifier 18. Each FET amplifier 18 comprises a circuit to provide an output voltage responsive to the current from its corresponding current amplifier 16. The output of the FET amplifiers 18 are connected to a transmission line transformer 20, which transforms the output impedance of the FET amplifiers 18 and multiplies the voltage. Preferably, the output of the transformer 20 has an impedance of 50 ohms, which matches the impedance of standard transmission lines. The output signal from the transformer 20 is applied to a load 74, which varies dependent upon the application.

In the preferred embodiment, the current amplifiers 16 include five current amplifiers, 16a, 16b, 16c, 16 d, 16e, which are connected to five corresponding FET power amplifiers 18a, 18b, 18c, 18d, 18e. In other embodiments, the number of current amplifiers 16 and corresponding FET power amplifiers 18 may be varied to be more or less than the number used in the preferred embodiment, depending on a number of factors such as the power needs of the load on the output. Although it is preferable that each current amplifier 16 have a corresponding FET amplifier 18, embodiments other than the preferred embodiment may comprise a configuration wherein each of the current amplifiers 16 is connected to one or more FET amplifiers 18, or one of the current amplifiers 16 may be connected to more than one FET amplifier 18.

In FIGS. 2, 3, and 4, the electrical components for the preferred embodiment are discussed by reference to a letter and a numeral, for example "R3". The letter indicates the type of electrical component; "R" indicates a resistor, "C" indicates a capacitor, "Q" indicates a transistor, "V" indicates a voltage source, and the number following the component indicates a specific component. The following table lists the components and their values, as used in the preferred embodiment.

| TABLE OF COMPONENT VALUES | |
|---|---|
| Component | Description |
| R1 | 10Ω resistor |
| R2 | 150Ω resistor |
| R3 | 91 |
| R4 | 3.6K |
| R5 | 3.6K |
| R6 | 24 |
| R7 | 24 |
| R8 | 510 |
| R9 | 510 |
| R10 | 10 |
| R11 | 2.2K |
| R12 | 10 |
| R13 | 300 |
| R14 | 10 |
| R15 | 150 |
| R16 | 10 |
| R17 | 100 |
| R18 | 10 |
| R19 | 62 |
| R20 | 100 |
| R21 | 1K |
| R22 | 10K |
| R23 | 10K |
| R24 | 10 |
| C1 | .1 μfarad capacitor, ceramic |
| C2 | .1 μfarad capacitor, ceramic |
| C3 | .1 μfarad capacitor, ceramic |
| C4 | .1 μfarad capacitor, ceramic |
| C5 | .1 μfarad capacitor, ceramic |
| C6 | .1 μfarad capacitor, ceramic |
| C7 | .1 μfarad capacitor, ceramic |
| C8 | (20×) .022 μfarad capacitor, ceramic, 1KV |
| C9 | (40×) .022 μfarad capacitor, ceramic, 1KV |
| C10 | .1 μfarad capacitor, ceramic |
| Q1 | BJT, 2N5583 |
| Q2 | BJT, 2N5943 |
| Q3 | BJT, 2N5943 |
| Q4 | BJT, 2N5943 |
| Q5 | BJT, MRF1035 |
| Q6 | BJT, MRF1090 |
| Q7 | Power MOSFET 440-2, or DE-275 501N12 |
| D1 | VARO 356X |
| $V_o$ | Voltage Source, 24 volts |
| $V_1$ | Voltage Source, 400 volts |

Referring now to FIG. 2, the preferred circuit for the inverting amplifier 12 (the input stage) and the buffer 14 is illustrated. A voltage source $V_o$ is connected to an input line 30, which is connected through a resistor R1 to a capacitor C1, a resistor R3, a resistor R6, and a resistor R7. The input signal is connected to a resistor R2 and a capacitor C2. The input signal is connected through the capacitor C2 to resistors R4,R5, to resistor R3, and to the base of a bipolar transistor Q1, which preferably is a radio frequency (rf) BJT transistor for high-frequency applications, 190 2N5583, available from Motorola. The capacitor C1, and the resistors R2,R4, and R5 are connected to a ground reference, illustrated by an arrow directed downward. The emitter of the transistor Q1 is connected to the resistor R6, and is also connected through a capacitor C3 to the resistor R7. The collector of the transistor Q1 is connected to a pair of resistors R8,R9 which are connected to the ground reference at their other ends. The collector of the transistor Q1 is coupled to an output line 32 of the input stage 11, which is connected to an input line 34 of the buffer 14.

The buffer 14 comprises a transistor Q2, a resistor R10, and a resistor R11. The transistor Q2 is preferably a radio frequency (rf) BJT transistor for high-frequency applications, #2N5943 available from Motorola. The input line 34 to the buffer 14 is coupled to the base of the bipolar transistor Q2. The collector of the transistor is coupled to the voltage source $V_o$ through the resistor R10. The emitter of the transmitter Q2 is coupled to ground through the resistor R11. The emitter of the transmitter Q2 is connected to the output line 36 of the buffer 14. The output line 36 is connected to an input line 38 to the current amplifiers 16. As previously stated in the discussion of the block diagram of FIG. 1, one or more current amplifiers 16 may exist in an embodiment of the present invention. Preferably, the single output 36 is connected directly to each of the current amplifiers 16.

A circuit diagram of one of the current amplifiers 16 is illustrated in FIG. 3. In general terms, each amplifier comprises a plurality of transistors in the Darlington configuration. A first stage, shown generally at 40, has a configuration that is repeated in subsequent stages 42,44,46. Specifically referring to the first stage 40, the input 38 is connected to the base of a transistor Q3, preferably a rf BJT transistor. The collector of the transistor Q3 is coupled to the voltage source $V_o$ through a resistor R12. A capacitor C4 is connected between the collector and ground. A resistor R13 is connected between the base and the emitter, which is connected to an output line 41 of the first stage 40, and the line 41 is connected to the input of the next stage 42. This configuration is repeated until following the last stage 46, a resistor R20 is connected between an output 48 from stage 46, and ground. However, in the third current amplifier stage 44, a transistor Q5 is preferably a microwave pulse power BJT transistor #MRF1035 availabe from Motorola. And in the fourth (and final) current amplifier stage 46, a transistor Q6 is preferably a microwave pulse power BJT transistor, #MRF1090 also available from Motorola.

The output 48 from each current amplifier 16 is connected to the corresponding FET amplifier 18, illustrated in FIG. 4. Each FET amplifier 18 comprises and FET section illustrated as 50a,50b,50c,50d,50e. Each FET section 50 comprises a capacitor C10, a resistor R24, and a power FET Q7. Each FET Q7 is configured, as is conventional, to include a gate as an input, a source and substrate connected to a reference voltage, and a drain connected to a higher voltage. The input to each FET section 50 is received on an input line 52, which is connected to the output line 48 from the corresponding current amplifier 16. The input line 52 is connected to the gate of the FET Q7. The capacitor C10 and the resistor R24 are connected in series between the gate and ground. The source of the FET Q7 is connected to ground and also to the substrate of the FET Q7. The drain of the FET Q7 is connected to a node 54, which is coupled to a voltage source $V_1$ through a resistor R22 in series with another resistor R21. At a node 56 between the resistors R21,R22, a capacitor C8 is connected between that node 56 and ground. Also, the cathode of a diode D1 is connected to the node 56, and the anode of the diode D1 is connected to the node 54.

The FETs Q7 are biased at or near an operational state by the voltage source $V_o$, applied through the inverting amplifier 12, the buffer 14, and the current amplifiers 16. Thus, in a DC analysis, an approximately constant voltage is applied across the gate and source of each FET Q7. The actual biasing voltage that is applied to the capacitor C10 is determined by the circuit between the voltage source $V_o$ and the capacitor; however, the biasing voltage remains approximately constant. Preferably the voltage of the voltage source $V_o$ is 24 volts, a value which, for the specified components, biases the FETs Q7 in an operating range wherein the relationship between input and output is approximately linear. In other embodiments, the voltage of the voltage source $V_o$ may differ, for example to compensate for electrical components having values differing from those specified.

In operation of the preferred embodiment, the inverting amplifier inverts the signal and amplifies the voltage by a gain of 20. The buffer 14 allows a fanout of the amplified signal to one or more current amplifiers, each with a gain of approximately 80dB. This voltage is passed on to the FET power amplifier 18 through the current amplifiers 16. The FET Q7 has been previously biased at or near an operational state by the voltage source 30, and thus the major remaining impediment to rise time is the input capacitance of the FET Q7. The input capacitance of the FET Q7 is substantially overwhelmed by the current available from the current amplifiers 16, thus allowing the pulse to rise quickly at the output of the FET Q7. A resistor 24 and a capacitor C10 are connected in series across the gate and source of the FET Q7, in order to limit the gain of the last current amplifier stage 46. An advantage is that the stability of the circuit at high frequencies (inherent in a quickly rising pulse) is enhanced.

The node 54 is coupled to the transmission line transformer 20 through a capacitance C9. Specifically, the node 54 is connected to one end of the capacitor C9, and the other end of the capacitor C9 is connected to a node 58, which is connected to the transmission line transformer 20. The node 58 is also connected to one end of a resistor R23, which is connected to ground at its other end.

The node 58 is connected to the input line 60 of the transmission line transformer 20. The transformer 20 comprises a plurality of transmission line sections 62, of conventional coaxial construction having a center conductor 64 surrounded by an outer conductor 66. Preferably, five transmission line sections 62a,62b,62c,62d,62e are included in the transformer 20, each section 62 having an impedance of 10Ω. Each transmission line 62 is wound with several turns around its own ferrite core 63, the number of turns being sufficient to provide a common mode inductance on each transmission line 62. The input line 60 to the transmission line transformer 20 is connected in parallel to each center conductor 64 of the transmission lines 62, and the ground is connected to each outer conductor 66 on the input side. On the output (other) side of each transmission line 62, a first output line 70 is connected to the center conductor 64a of the transmission line section 62a, a second output line 72 is connected to the outer conductor 66e of the transmission line section 62e, the outer conductor 66a is connected to the center conductor 64b, the outer conductor 66b is connected to the center conductor 64c, the outer conductor 66c is connected to the center conductor 64d, and the outer conductor 66d is connected to the center conductor 64e. In one preferred configuration wherein the five sections 62 each have an impedance of 10Ω, the output impedance is 50Ω which matches the standard 50Ω impedance of conventional transmission lines. In other embodiments, the impedance of the sections 62 may be varied to obtain a different output impedance, for example a 75Ω output impedance is produced by five sections of 15Ω transmission line. Furthermore the number of transmission line sections 62 may be varied to obtain a different output impedance, for example a 40Ω output impedance would be produced by four sections of 10Ω transmission line. In addition, the input resistance of the impedance transformer 20 is substantially resistive. Although the preferred embodiment comprises an equal number of FET amplifiers 50 and transmission lines 62, the respective number of each may be set independently. For example, in some applications three FET amplifiers 50 and seven transmission lines 62 may be advantageous.

$V_1$ is the voltage source to the FET power amplifier 18, providing 400 volts in the preferred embodiment; however the output of each FET Q7 provides approximately 360 volts because about 40 volts is dropped across each FET Q7. At the output of the transmission line transformer 20, the voltage between each of the output lines 64,66 (360 volts) is multiplied by the five transmission line sections 62 in parallel, and thus the maximum output voltage is 1800 volts. Because the FET amplifier 18 controls the input voltage between 0 and 360 volts, the output can be varied between 0 and 1800 volts. In other embodiments, the number of transmission line sections 62 may be changed to obtain a different output voltage, for example if four transmission line sections 62 were to be used, the output voltage could by varied between 0 and 1440 volts, while the output impedance of the transformer 20 would vary accordingly.

Figure 8:
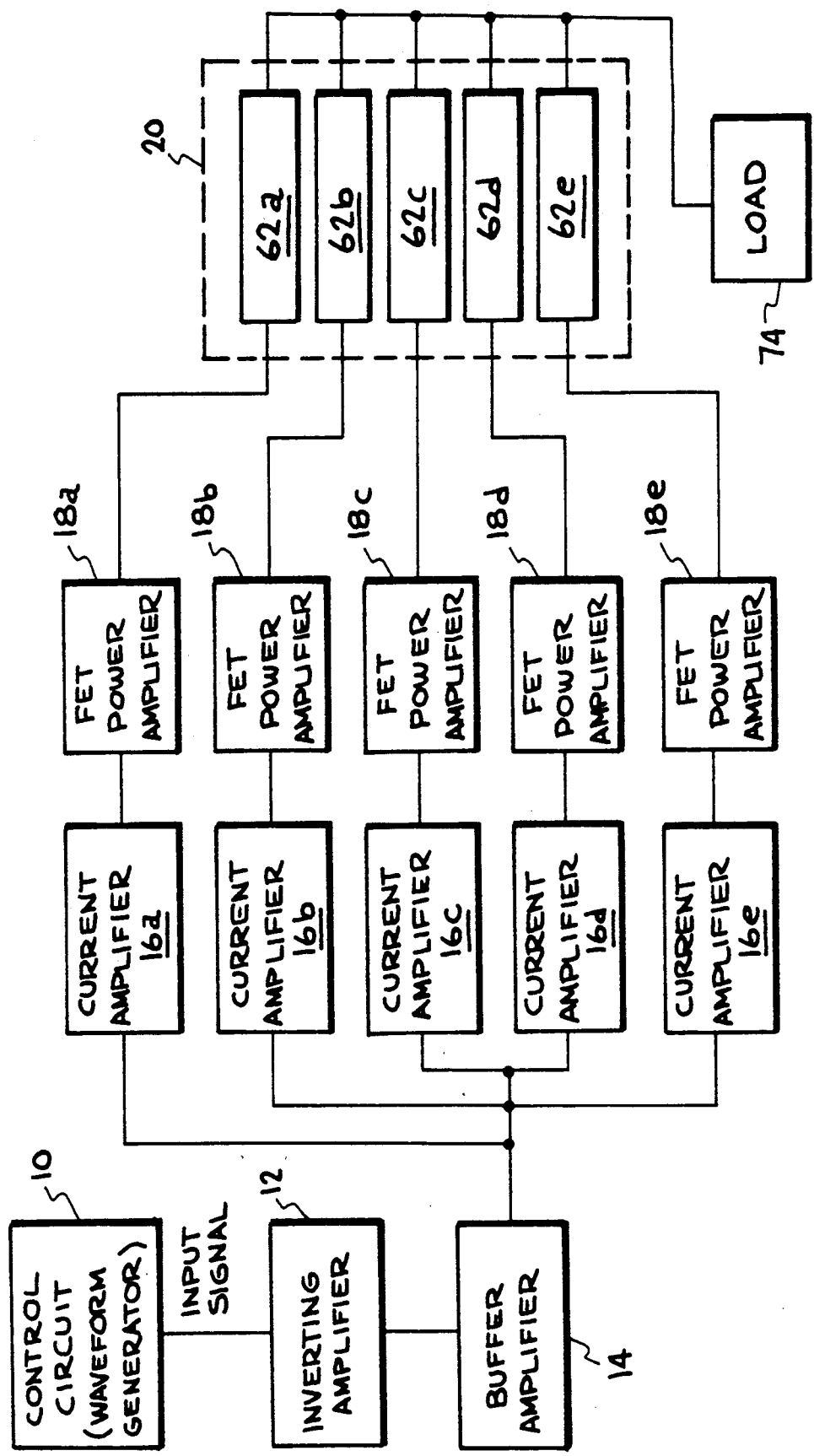
FIG. 8 is a block diagram of an alternative embodiment of the present invention.

In another embodiment illustrated in FIG. 8, an equal number of FET power amplifiers 18 and transmission line 62 is advantageous. In this embodiment, each FET amplifier 18 is connected independently to a respective transmission line 62. For example, in FIG. 8 the output of the FET amplifier 18a is coupled to the transmission line 62a without a direct connection to the other FET amplifiers 18b, 18c,18d, 18e. In like manner, the output of the FET amplifier 18b is coupled to the transmission line 62b, and so forth. Such an embodiment may provide a modular design, and furthermore may be more stable than the preferred embodiment, which has a common output connection through the node 58 illustrated in FIG. 4.

The output signal from the transmission line transformer 20 on the output lines 70,72 is provided to a load, represented in a block 74. The load 74 may comprise any of a plurality of loads. In a preferred embodiment the load 74 comprises an electro-optic crystal such as lithium niobate (LiNbO$_3$), or potassium dideuterium phosphate (KD*P). The electro-optic crystal may be used to Q-switch a laser, for example, or to modulate its beam characteristics.

Figure 5:
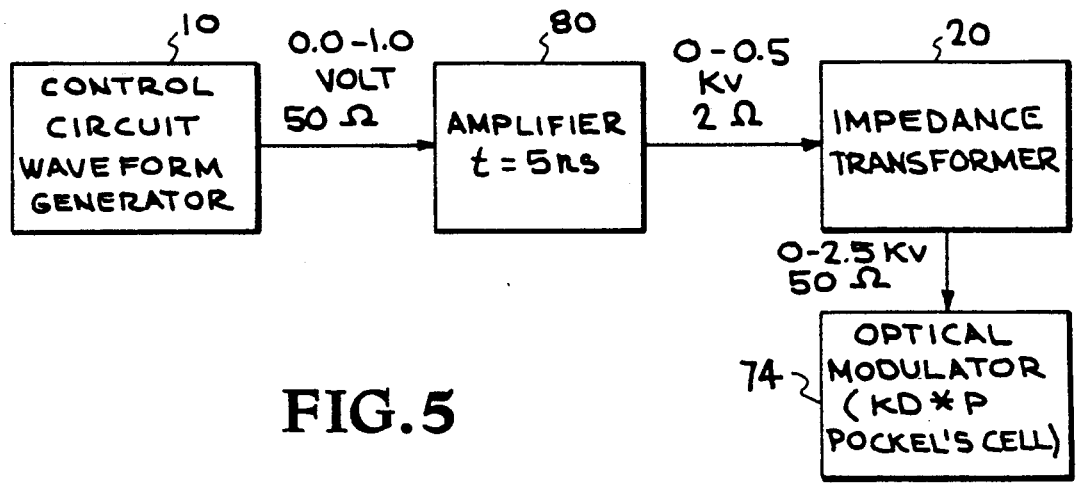
FIG. 5 is a block diagram of a configuration of an electrical system that embodies the present invention.
Figure 6:
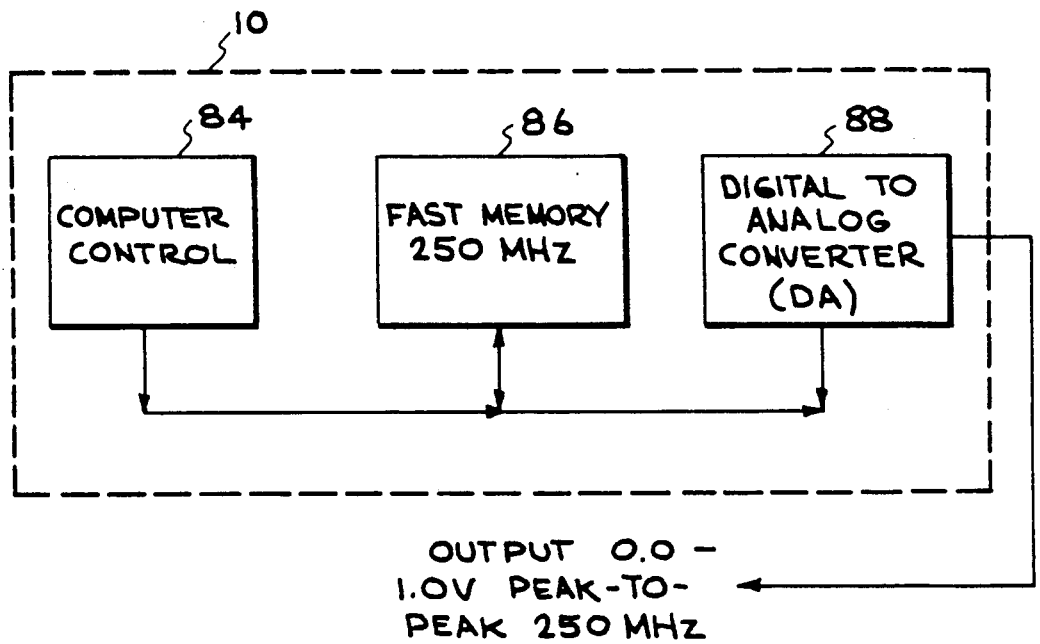
FIG. 6 is an example of a circuit that can provide the input signal to the amplifier of the present invention.

In operation, a waveform is generated by a conventional program in the control circuit 10. Illustrated in FIG. 5 is a block diagram of an electrical system that produces a pulse using the principles of the present invention. A control system (or waveform generator) 10 produces a pulse having a voltage between 0.0 volts and -1.0 volt with an output impedance of 50Ω. An example of such control system is illustrated in FIG. 6. A computer 84 generates a series of values which is stored in a fast memory 86. The computer then generates a clock signal at 250MHz which is applied to clock a digital-to-analog converter 88 while accessing the appropriate memory location in the fast memory 86. This output has an analog shape that is determined by the series of accessed values. In the preferred embodiment, the semiconductors such as the fast memory 86 and the D/A converter 88 are of the ECL type, and provide an output between 0.0 and -1.0 volt at a frequency of 250MHz. Other control circuits 10 may comprise another type of semiconductor technology, a different voltage range, and/or a different frequency of operation without substantially affecting the principles of the present invention.

The pulse generated by the control circuit 10 has a generally rising shape, and is applied to an amplifier, shown generally at 80. This amplifier 80 may comprise any of the circuits such as the inverting amplifier 12, the buffer amplifier 14, one or more of the current amplifiers 16, and one or more of the FET power amplifiers 18. In the preferred embodiment, the amplifier 80 drives an output impedance of 2Ω with an output voltage approximately between 0-360 volts, and has a rise time of six nanoseconds.

In order to transmit the pulse to the load without substantial loss of power, the output of the FET power amplifier 18 is applied to the impedance transformer 20, which changes the impedance to 50Ω and multiplies the voltage by a factor of five. For example, if the output of the amplifier 80 provides a voltage range from 0.0 to 0.5 KV, then the output of the impedance transformer will range from 0.0 to 2.5 KV. This output is now suitable for transmission along a 50Ω transmission line, and to transfer energy to the load 74, such as an optical modulator.

Figure 7:
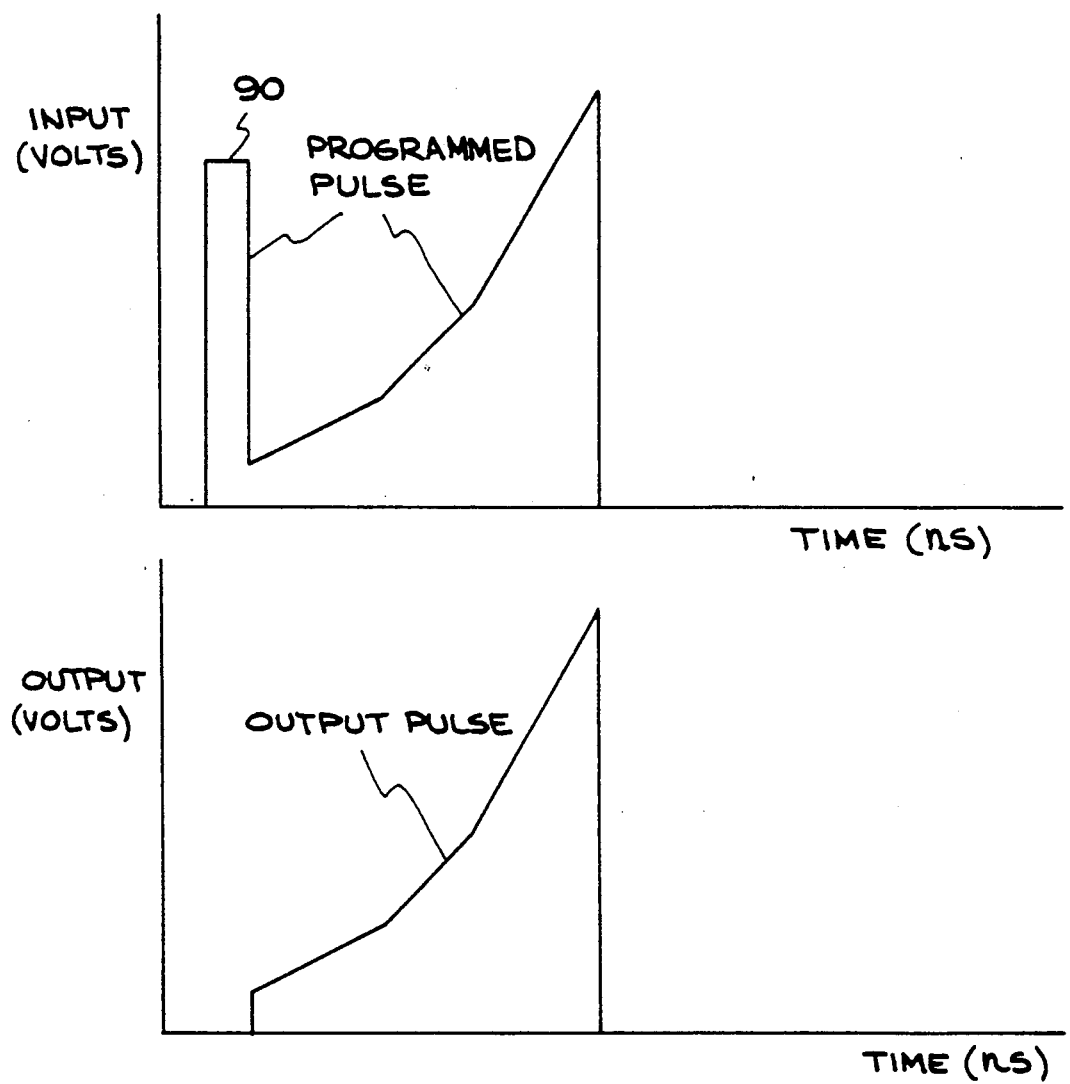
FIG. 7 is a graphical representation of the relationship between the voltage of input signal and the output signal over time.

The output pulse produced by the preferred embodiment is controllable during the rising part of the input pulse; during any time during which the output is falling or is at a low level, the decay of the circuit is not controlled by the input but is instead determined in part by the circuit components. As an example of the waveform that can be produced by the present invention, FIG. 7 illustrates the relationship between the input and the output pulses. A pulse 90 is programmed into the input pulse in an amount necessary to overcome capacitances such as the circuit capacitance. This pulse 90 is not passed through to the output because it just charges the FET gate capacitance to an operational point; however the remainder of the programmed pulse is closely correlated with the output during the time period that the the pulse is rising. This pulse can be used for example to pulse an electro-optic modulator.

The invention may be embodied in other specific forms without departing from its spirit or essential characteristics. The described embodiment is to be considered in all respects only as illustrative and not restrictive and the scope fo the invention is indicated by the appended claims rather than by the foregoing descriptions. All changes which come within the meaning and range of equivalency of the claims are to be embraced within their scope.

We claim:

1. An electrical circuit for providing a high voltage output across a first terminal and a second terminal, the output being responsive to a low voltage control input, said electrical circuit comprising:
    an amplifier circuit coupled to the low voltage control input, said amplifier circuit comprising,
    an input stage coupled to the low voltage input,
    a current amplifier coupled to the input section, and
    a FET connected to the current amplifier, said amplifier circuit having an output provided across a first line and a second line; and,
    an impedance transformer coupled to the output of the amplifier, said transformer comprising a plurality of transmission lines including a first transmission line, at least one intermediate transmission line, and a final transmission line, each transmission line comprising,
    an input including a first input line coupled to the first line of the amplifier output, and a second input line coupled to the second line of the amplifier output, and
    an output including a first output line and a second output line, wherein the first output line of the first transmission line is connected to the first terminal, the second output of the first transmission line is connected to the first output of the subsequent transmission line, the second output of the subsequent transmission line is connected to the first output of the next subsequent transmission line, and so forth in repeating fashion for each successive transmission line until in the final transmission line, the second output line of the final transmission line is connected to the second terminal, so that a high voltage output is provided across the first and the second terminals.

2. The electrical circuit as claimed in claim 1, wherein the current amplifier comprises at least one bipolar high speed transistor connected in a Darlington configuration.

3. The electrical circuit as claimed in claim 1, further comprising a means for biasing the FET, said biasing means including a DC voltage source connected to the input stage, said voltage source being coupled through the circuit to the gate of the FET.

4. The electrical circuit as claimed in claim 3, further comprising a number of ferrite cores equalling the number of transmission lines, wherein a length of each transmission line is wrapped around its corresponding ferrite core.

5. The electrical circuit as claimed in claim 1, further comprising a resistor capacitively coupled between the gate and source of the FET, whereby the adjacent current amplifier stage is limited in gain, and circuit stability is enhanced.

6. The electrical circuit as claimed in claim 1, further comprising an electro-optic crystal coupled to the first terminal and the second terminal, so that the output of the electrical circuit is applied across the electro-optic crystal.

7. An electrical circuit for providing a high voltage output across a first terminal and a second terminal, said high voltage output being responsive to a low voltage control input, said electrical circuit comprising:
   an amplifier circuit coupled to the control input, said circuit including a current amplifier;
   an input stage and a buffer coupling the control input and the amplifier circuit,
   a FET coupled to the current amplifier, said FET providing an output across its drain and source;
   means for biasing the FET into its approximately linear mode of operation, so that the FET operates in a substantially linear mode during a rising portion of the input waveform, said biasing means including a DC voltage source connected to the input stage, said voltage source being coupled through the circuit to the gate of the FET; and,
   a transformer coupled to the output of the FET, said transformer comprising a plurality of transmission lines.

8. The electrical circuit as claimed in claim 7, further comprising a resistor capacitively coupled between the gate and source of the FET, whereby the current amplifier stage preceding the FET is limited in gain by the resistor, and circuit stability is enhanced.

9. The electrical circuit as claimed in claim 8, wherein said transformer comprises a plurality of transmission lines including a first transmission line, at least one intermediate transmission line, and a final transmission line, each transmission line comprising,
   an input including a first input line coupled to the drain of the FET, and a second input line coupled to the source of the FET,
   an output including a first output line and a second output line, wherein the first output line of the first transmission line is connected to the first terminal, the second output of the first transmission line is connected to the first output of the subsequent transmission line, the second output of the subsequent transmission line is connected to the first output of the next subsequent transmission line, and so forth in repeating fashion for each successive transmission line until in the final transmission line, the second output line of the final transmission line is connected to the second terminal, so that a high voltage output is provided across the first and the second terminals, with the output impedance being determined in part by the number of transmission lines and their individual impedance.

10. The electrical circuit as claimed in claim 9, further comprising a number of ferrite cores equalling the number of transmission lines, wherein a length of each transmission line is wrapped around its corresponding ferrite core.

11. The electrical circuit as claimed in claim 10, wherein the number of transmission lines is five, and the transmission lines each have an impedance of approximately $10\Omega$, thus providing an output impedance of approximately $50\Omega$.

12. The electrical circuit as claimed in claim 9, further comprising at least one FET connected in parallel with the first FET.

13. The electrical circuit as claimed in claim 12, wherein the total number of FETs is five.

14. The electrical circuit as claimed in claim 7, wherein the current amplifier comprises at least one bipolar microwave pulsed power transistor connected in a Darlington configuration.

15. The electrical circuit as claimed in claim 14 further comprising a resistor capacitively coupled between the gate and source of the FET, whereby the current amplifier stage preceding the FET is limited in gain by the resistor, and circuit stability is enhanced.

16. The electrical circuit as claimed in claim 15, further comprising a high voltage power supply having a terminal coupled to the drain of the FET and an opposite polarity terminal coupled to the source of the FET.

17. An electrical circuit for providing a pulse in response to an input control signal, said circuit comprising:
   an input stage comprising a means for amplifying the voltage of the input control signal;
   a buffer connected to the input stage;
   a current amplifier connected to the buffer, said current amplifier having an output voltage responsive to the voltage of the input control signal,
   a FET coupled to the output of the current amplifier;
   means for biasing the FET into its approximately linear mode of operation, so that the FET operates in a substantially linear mode during a rising portion of the input waveform; and
   a transmission line transformer coupled to the output of the FET, said transformer having an impedance that is substantially resistive.

18. The electrical circuit as claimed in claim 17, wherein the current amplifier comprises a plurality of bipolar transistors in a Darlington configuration.

19. The electrical circuit as claimed in claim 18 wherein the bipolar transistors comprise a pulsed power transistor.

20. The electrical circuit as claimed in claim 17, comprising a plurality of current amplifiers and an equal number of FETs, the input of each current amplifier being coupled to the buffer, the output of each current amplifier being coupled to, and associated with, the input of a respective FET.

21. The electrical circuit as claimed in claim 20, wherein the biasing means includes a DC voltage source connected to the input stage, said voltage source being coupled through the circuit to the gate of each FET.

22. The electrical circuit as claimed in claim 21, further comprising a plurality of resistors connected to the plurality of FETs, each resistor being capacitively coupled between the gate and source of a respective FET, whereby the current amplifier stage preceding each FET is limited in gain by the respective resistor, and circuit stability is enhanced.

* * * * *